United States Patent
Park

(10) Patent No.: US 9,595,913 B2
(45) Date of Patent: Mar. 14, 2017

(54) SOLAR CELL APPARATUS

(75) Inventor: Chi Hong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 715 days.

(21) Appl. No.: 13/322,046

(22) PCT Filed: Sep. 30, 2010

(86) PCT No.: PCT/KR2010/006706
§ 371 (c)(1),
(2), (4) Date: Nov. 22, 2011

(87) PCT Pub. No.: WO2011/040779
PCT Pub. Date: Apr. 7, 2011

(65) Prior Publication Data
US 2012/0180843 A1    Jul. 19, 2012

(30) Foreign Application Priority Data

Sep. 30, 2009  (KR) .................. 10-2009-0093622
Sep. 30, 2009  (KR) .................. 10-2009-0093636

(51) Int. Cl.
| | | |
|---|---|---|
| *H02N 6/00* | (2006.01) | |
| *H01L 31/042* | (2014.01) | |
| *H02S 40/34* | (2014.01) | |
| *H01L 31/02* | (2006.01) | |
| *H01L 31/046* | (2014.01) | |
| *H01L 31/044* | (2014.01) | |

(52) U.S. Cl.
CPC .......... *H02S 40/34* (2014.12); *H01L 31/0201* (2013.01); *H01L 31/044* (2014.12); *H01L 31/046* (2014.12); *Y02E 10/50* (2013.01)

(58) Field of Classification Search
CPC .................. H01L 31/0201; H01L 31/02021
See application file for complete search history.

(56) References Cited

U.S. PATENT DOCUMENTS

| | | | | |
|---|---|---|---|---|
| 4,306,183 A | * | 12/1981 | Wright ................... | G05F 1/613 |
| | | | | 136/293 |
| 4,314,198 A | * | 2/1982 | Rogers ................... | H02J 7/35 |
| | | | | 136/291 |
| 4,514,579 A | | 4/1985 | Hanak | |
| 4,567,316 A | | 1/1986 | Hollaus et al. | |

(Continued)

FOREIGN PATENT DOCUMENTS

| | | | |
|---|---|---|---|
| CN | 1537351 A | | 10/2004 |
| CN | 201204475 Y | * | 3/2009 |

(Continued)

OTHER PUBLICATIONS

Office Action dated Mar. 5, 2014 in Chinese Application No. 201080043361.4.

(Continued)

*Primary Examiner* — Eli Mekhlin
(74) *Attorney, Agent, or Firm* — Saliwanchik, Lloyd & Eisenschenk

(57) ABSTRACT

Provided is a solar cell apparatus. The solar cell apparatus includes: a substrate; a first cell group on the substrate; a second cell group on the substrate; a first diode connected in parallel to the first cell group; and a second diode connected in parallel to the second cell group.

6 Claims, 8 Drawing Sheets

(56) References Cited

U.S. PATENT DOCUMENTS

| | | | |
|---|---|---|---|
| 5,593,901 A * | 1/1997 | Oswald et al. ............... | 438/80 |
| 5,669,987 A * | 9/1997 | Takehara et al. ............. | 136/244 |
| 6,121,542 A | 9/2000 | Shiotsuka et al. | |
| 6,218,606 B1 * | 4/2001 | Morizane et al. ............ | 136/251 |
| 6,545,211 B1 * | 4/2003 | Mimura ........................ | 136/244 |
| 2003/0000565 A1 | 1/2003 | Hayashi et al. | |
| 2003/0062078 A1 | 4/2003 | Mimura | |
| 2004/0123894 A1 | 7/2004 | Erban | |
| 2006/0103371 A1 | 5/2006 | Manz | |
| 2006/0219291 A1 | 10/2006 | Hikosaka et al. | |
| 2007/0227580 A1 * | 10/2007 | Nakajima et al. ............ | 136/244 |
| 2008/0143188 A1 * | 6/2008 | Adest ..................... | H02J 1/102 307/82 |
| 2009/0044852 A1 | 2/2009 | Shadbolt et al. | |
| 2009/0056785 A1 * | 3/2009 | Johnson et al. ............. | 136/246 |
| 2010/0007212 A1 | 1/2010 | Zanarini et al. | |
| 2010/0034455 A1 | 2/2010 | Harada et al. | |
| 2010/0060307 A1 * | 3/2010 | Kamieniecki ............... | 324/765 |
| 2011/0017279 A1 | 1/2011 | Baumbach et al. | |

FOREIGN PATENT DOCUMENTS

| | | |
|---|---|---|
| JP | S60-182178 A | 9/1985 |
| JP | 06-60155 A | 3/1994 |
| JP | H09-266321 A | 10/1997 |
| JP | H09-275644 A | 10/1997 |
| JP | H11-330521 A | 11/1999 |
| JP | 2000-164910 A | 6/2000 |
| JP | 2000-269531 A | 9/2000 |
| JP | 2001-068696 A | 3/2001 |
| JP | 2002-246628 A | 8/2002 |
| JP | 2003-037280 A | 2/2003 |
| JP | 2003-282916 A | 10/2003 |
| JP | 2005-191578 A | 7/2005 |
| JP | 2006-216608 A | 8/2006 |
| JP | 2009-200445 A | 9/2009 |
| KR | 10-0288866 B1 | 6/2001 |
| KR | 10-2006-0105535 A | 10/2006 |
| KR | 10-0673138 B1 | 1/2007 |
| KR | 10-2007-0016138 A | 2/2007 |
| KR | 20-2009-0003860 U | 4/2009 |
| KR | 10-2009-0077778 A | 7/2009 |
| WO | WO-2005/101511 A1 | 10/2005 |
| WO | WO 2007/125778 A1 | 11/2007 |
| WO | WO 2009/112503 A1 | 9/2009 |

OTHER PUBLICATIONS

Office Action dated Aug. 19, 2014 in Japanese Application No. 2012-532015.
Japanese Office Action dated Feb. 4, 2014 in Japanese Application No. 2012-532015.
Notice of Allowance dated Jan. 27, 2011 in Korean Application No. 10-2009-0093636, filed Sep. 30, 2009.
Notice of Allowance dated Sep. 8, 2011 in Korean Application No. 10-2009-0093622, filed Sep. 30, 2009.
International Search Report in International Application No. PCT/KR2010/006706, filed Sep. 30, 2010.

* cited by examiner

SOLAR CELL APPARATUS

CROSS-REFERENCE TO RELATED APPLICATIONS

This application is the U.S. national stage application of International Patent Application No. PCT/KR2010/006706, filed Sep. 30, 2010, which claims priority to Korean Application No. 10-2009-0093636, filed Sep. 30, 2009 and Korean Application No. 10-2009-0093622, filed Sep. 30, 2009, the disclosures of each of which are incorporated herein by reference in their entirety.

TECHNICAL FIELD

The present disclosure relates to a solar cell apparatus.

BACKGROUND ART

A solar battery generates photoelectro-motive force using a plurality of P-N junction cells. The plurality of P-N junction cells are connected in the form of a module according to capacity and a plurality of modules having a predetermined capacity are connected in series or parallel in a circuit to constitute an array.

A solar cell system requires almost no more future maintenance costs once the initial investment costs are collected and also has no moving parts so that energy is supplied with less mechanical defects.

In general, in order to supply electricity generated from a solar battery module to a system, the minimum group of a plurality of battery cells in series is electrically connected to a junction box through a bus bar.

However, if a solar battery panel is shaded by an external object or is covered by impurity or foreign substance, a shaded or covered cell becomes overloaded and overheated.

DISCLOSURE

Technical Problem

Embodiments provide a solar cell apparatus having improved efficiency of electricity generation.

Technical Solution

In one embodiment, a solar cell apparatus includes:
a substrate;
a first cell group on the substrate;
a second cell group on the substrate;
a first diode connected in parallel to the first cell group; and
a second diode connected in parallel to the second cell group.

In another embodiment, a solar cell apparatus includes:
a substrate;
a first cell group on the substrate;
a second cell group on the substrate; and
an error detection unit detecting at least one error from the first cell group and the second cell group.

In further another embodiment, a solar cell apparatus includes:
a substrate;
a first cell group on the substrate;
a second cell group on the substrate;
a junction box attached to the substrate;
a first bus bar connected to the first cell group and extending to the junction box;
a connection electrode connected to the first cell group and the second cell group and extending to the junction box; and
a second bus bar connected to the second cell group and extending to the junction box.

Advantageous Effects

In a solar cell apparatus according to an embodiment, a plurality of cell groups are disposed on a substrate. Additionally, in relation to a solar cell apparatus according to an embodiment, bus bars and connection electrodes are connected to cell groups, respectively, so that the cell groups may be separately driven.

That is, in relation to a solar cell apparatus according to an embodiment, a diode is connected in parallel to each of cell groups, so that each of the cell groups may generate power separately. That is, when a first cell group cannot generate power due to shadow, a current formed by a second cell group may flow through a first diode. That is, the disabled first cell group may not affect the second cell group.

Additionally, a solar cell apparatus according to an embodiment may include an error detection unit for detecting errors of cell groups. Especially, a solar cell apparatus according to an embodiment may detect an error in each cell group.

Like this, in relation to a solar cell apparatus according to an embodiment, each cell group is separately driven and an error thereof may be easily detected. Accordingly, in relation to a solar cell apparatus according to an embodiment, even when there are some disabled cell groups, the entire cell groups may not be disabled and some of the cell groups are still driven. Additionally, a solar cell apparatus according to an embodiment may easily detect cell groups having detected errors and its situation may be resolved promptly.

Accordingly, a solar cell apparatus according to an embodiment prevents the deterioration of photoelectric conversion efficiency and thus improves the photoelectric conversion efficiency.

Additionally, a solar cell apparatus according to an embodiment may include a power supply unit to provide power to an error detection unit by itself. Additionally, a solar cell apparatus according to an embodiment may easily transmit signals detected through a signal output unit to external.

BEST MODEL

In the description of embodiments, it will be understood that when a substrate, layer, film, or electrode is referred to as being 'on' or 'under' another substrate, layer, film, or electrode, the terminology of 'on' and 'under' includes both the meanings of 'directly' and 'indirectly'. Further, the reference about 'on' and 'under' each component will be made on the basis of drawings. In addition, the sizes of elements and the relative sizes between elements may be exaggerated for further understanding of the present disclosure.

Figure 1:
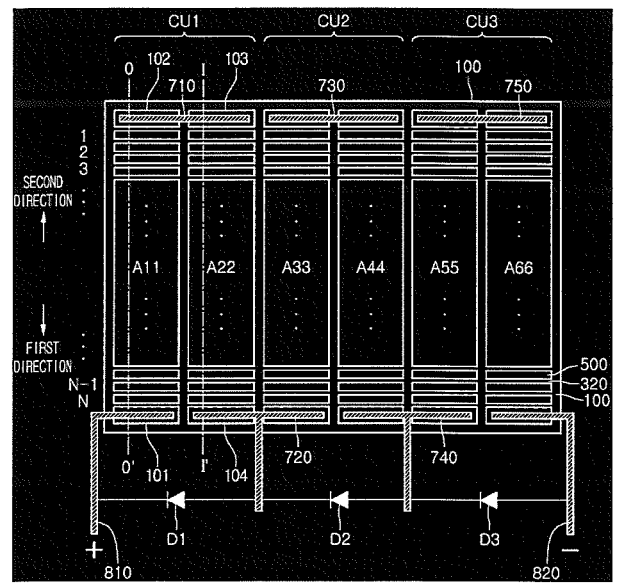
FIG. 1 is a plan view of a solar battery module according to a first embodiment.
Figure 2:
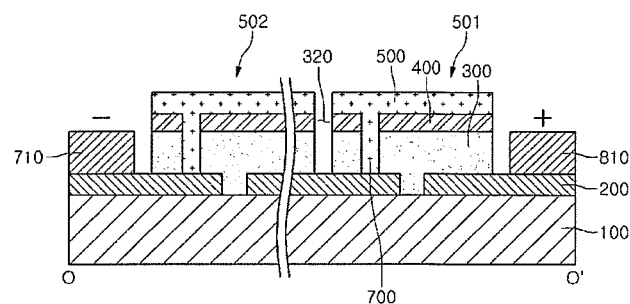
FIG. 2 is a sectional view taken along the line 0-0' of FIG. 1.
Figure 3:
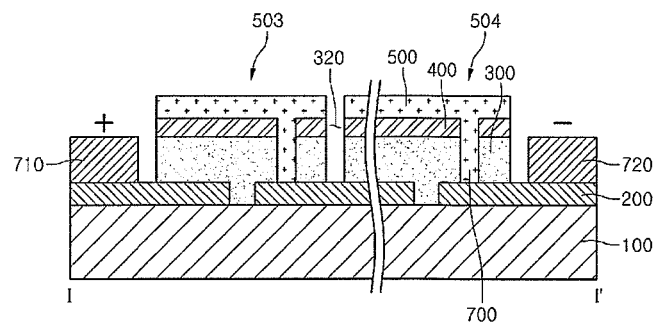
FIG. 3 is a sectional view taken along the line I-I' of FIG. 1.
Figure 4:
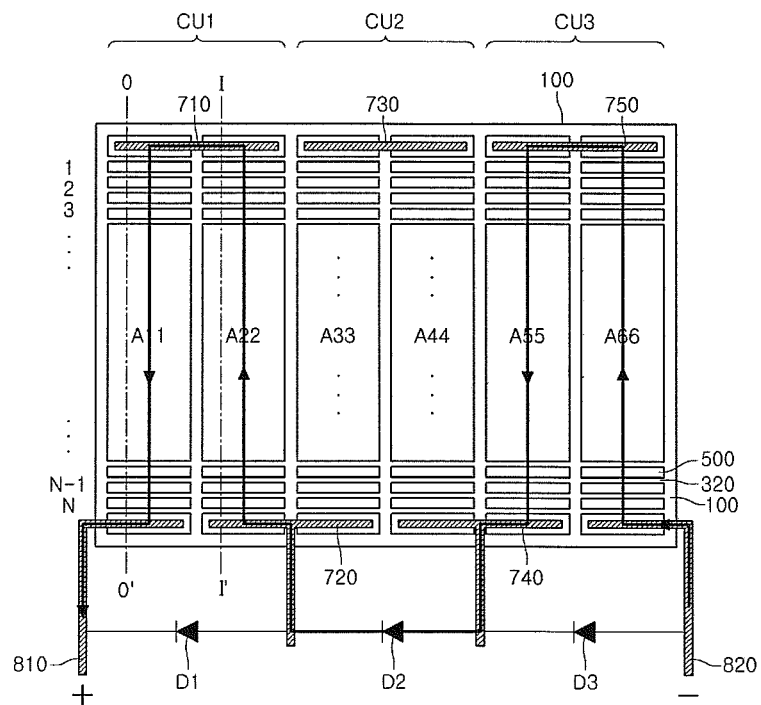
FIG. 4 is a view of a current path when a second cell group does not operate.
Figure 5:
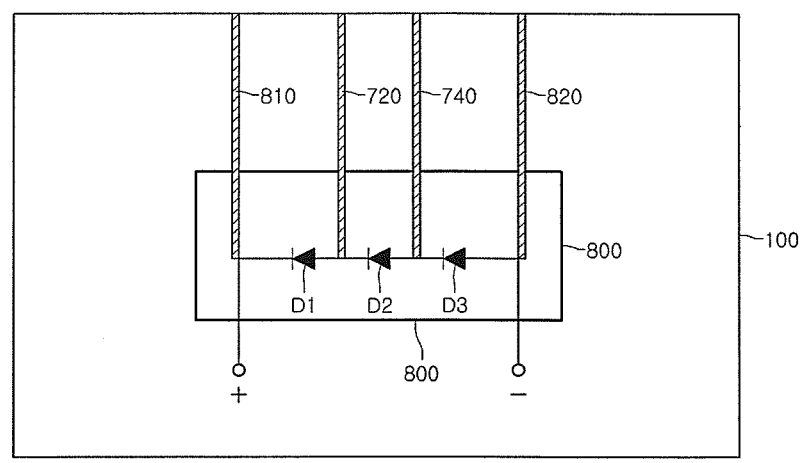
FIG. 5 is a plan view illustrating the rear side of a solar battery module according to a first embodiment.

FIG. 1 is a plan view of a solar battery module according to a first embodiment. FIG. 2 is a sectional view taken along the line 0-0' of FIG. 1. FIG. 3 is a sectional view taken along the line I-I' of FIG. 1. FIG. 4 is a view of a current path when a second cell group does not operate. FIG. 5 is a plan view illustrating the rear side of a solar battery module according to a first embodiment.

Referring to FIGS. 1 to 5, the solar battery module according to the first embodiment includes a substrate 100, a plurality of cell groups CU1, CU2, and CU3, a plurality of connection electrodes 810, 710, 720, 730, 740, 750, and 820, a plurality of diodes D1, D2, and D3, and a junction box 800.

The substrate 100 supports the plurality of cell groups CU1, CU2, and CU3, the plurality of connection electrodes 810, 710, 720, 730, 740, 750, and 820, the plurality of diodes D1, D2, and D3, and the junction box 800. The substrate 100 may have a plate shape. The substrate 100 may be an electrical insulator. The substrate 100 may be a glass substrate, a plastic substrate, or a stainless steel substrate. In more detail, the substrate 100 may be a soda lime glass substrate.

The cell groups CU1, CU2, and CU3 are disposed on the substrate 100. The cell groups CU1, CU2, and CU3 may be connected in series to each other. Additionally, each of the cell groups CU1, CU2, and CU3 may include a plurality of cells connected in series to each other. For example, the cell groups may include a first cell group CU1, a second cell group CU2, and a third cell group CU3.

The first cell group CU1 includes first cells A11 and second cells A22.

The number of the first cells A11 may be N. The first cells A11 are connected in series to each other. Additionally, the first cells A11 may be disposed in a first column. A current generated in the first cells A11 may flow in a first direction.

The number of the second cells A22 may be N. The second cells A22 are connected in series to each other. Additionally, the second cells A22 may be disposed in a second column. At this point, a current generated in the second cells A22 may flow in a second direction opposite to the first direction.

Additionally, the first cells A11 may be connected in series to the second cells A22. That is, the first cells A11 and the second cells A22 are connected in series to each other.

The second cell group CU2 includes third cells A33 and fourth cells A44.

The number of the third cells A33 may be N. The third cells A33 are connected in series to each other. Additionally, the third cells A33 may be disposed in a third column. A current generated in the third cells A33 may flow in the first direction.

The number of the fourth cells A44 may be N. The fourth cells A44 are connected in series to each other. Additionally, the fourth cells A44 may be disposed in a fourth column. At this point, a current generated in the fourth cells A44 may flow in the second direction opposite to the first direction.

Additionally, the third cells A33 may be connected in series to the fourth cells A44. That is, the third cells A33 and the fourth cells A44 are connected in series to each other.

The third cell group CU3 includes fifth cells A55 and sixth cells A66.

The number of the fifth cells A55 may be N. The fifth cells A55 are connected in series to each other. Additionally, the fifth cells A55 may be disposed in a fifth column. A current generated in the fifth cells A55 may flow in the first direction.

The number of the sixth cells A66 may be N. The sixth cells A66 are connected in series to each other. Additionally, the sixth cells A66 may be disposed in a sixth column. At this point, a current generated in the sixth cells A66 may flow in the second direction opposite to the first direction.

Additionally, the fifth cells A55 may be connected in series to the sixth cells A66. That is, the fifth cells A55 and the sixth cells A66 are connected in series to each other.

The connection electrodes 810, 710, 720, 730, 740, 750, and 820 are conductors. The connection electrodes 810, 710, 720, 730, 740, 750, and 820 may be formed of a material (for example, a metal having low resistance such as copper or silver).

The connection electrodes 810, 710, 720, 730, 740, 750, and 820 connect the cell groups CU1, CU2, and CU3. Additionally, the connection electrodes 810, 710, 720, 730, 740, 750, and 820 may connect the cells A11 to A66 in each column. Additionally, the connection electrodes 810, 710, 720, 730, 740, 750, and 820 may connect the cell groups CU1, CU2, and CU3 to wirings connected to an external charging device or an adjacent solar battery module.

The connection electrodes may be a first bus bar 810, a first connection electrode 710, a second connection electrode 720, a third connection electrode 730, a fourth connection electrode 740, a fifth connection electrode 750, and a second bus bar 820.

The first bus bar 810 is connected to the first cells A11. In more detail, the first bus bar 810 may directly contact the last cell 101 of the first cells A11. The first bus bar 810 may be connected to a wiring connected to an external device.

The first bus bar 810 extends from the last cell 101 of the first cells A11 to the junction box 800. That is, the first bus bar 810 extends from the top side of the substrate 100 to the rear side.

The first connection electrode 710 connects the first cells A11 and the second cells A22. In more detail, the first connection electrode 710 connects the first cell 102 of the first cells A11 and the first cell 103 of the second cells A22.

Additionally, as shown in FIGS. 2 and 3, the first cells A11 may have a symmetric structure to the second cells A22. That is, the first connection electrode 710 is connected to the front electrode of the first cell 102 of the first cells A11 and is connected to the back electrode of the first cell 103 of the second cells A22. That is, the first connection electrode 710 connects the respectively different electrodes of the first cell 102 of the first cells A11 and the first cell 103 of the second cells A22.

In the same manner, the first bus bar 810 may be connected to the back electrode of the last cell 101 of the first cells A11 and may be connected to the front electrode of the last cell 104 of the second cells A22.

The second connection electrode 720 connects the first cell group CU1 and the second cell group CU2. In more detail, the second connection electrode 720 connects the second cells A22 and the third cells A33. In more detail, the second connection electrode 720 connects the last cell 104 of the second cells A22 and the last cell of the third cells A33.

The second connection electrode 720 extends from the top side of the substrate 100 to the rear side. That is, the second connection electrode 720 extends from the second cells A22 and the third cells A33 to the junction box 800.

The third connection electrode 730 connects the third cells A33 and the fourth cells A44. In more detail, the third connection electrode 730 connects the first cell of the third cells A33 and the first cell of the fourth cells A44. That is, the third connection electrode 730 contacts the first cell of the third cells A33 and the first cell of the fourth cells A44.

The fourth connection electrode 740 connects the second cell group CU2 and the third cell group CU3. In more detail, the fourth connection electrode 740 connects the fourth cells A44 and the fifth cells A55. In more detail, the second connection electrode 740 connects the last cell of the fourth cells A44 and the last cell of the fifth cells A55.

The fourth connection electrode 740 extends from the top side of the substrate 100 to the rear side. That is, the fourth connection electrode 740 extends from the fourth cells A44 and the fifth cells A55 to the junction box 800.

The fifth connection electrode 750 connects the fifth cells A55 and the sixth cells A66. In more detail, the fifth connection electrode 750 connects the first cell of the fifth cells A55 and the first cell of the sixth cells A66. That is, the fifth connection electrode 750 contacts the first cell of the fifth cells A55 and the first cell of the sixth cells A66.

The second bus bar 820 is connected to the sixth cells A66. In more detail, the second bus bar 820 may directly contact the top side of the last cell of the sixth cells A66. The second bus bar 820 may be connected to a wiring connected to an external device.

The second bus bar 820 extends from the last cell of the sixth cells A66 to the junction box 800. That is, the second bus bar 820 extends from the top side of the substrate 100 to the rear side. At this point, the first bus bar 810 may be connected to a (+) output terminal and the second bus bar 820 may be connected to a (−) output terminal.

The diodes D1, D2, and D3 are separately connected to the connection electrodes 810, 710, 720, 730, 740, 750, and 820. The diodes D1, D2, and D3 are disposed on the rear side of the substrate 100. The diodes D1, D2, and D3 are disposed in the junction box 800.

The diodes D1, D2, and D3 may be a first diode D1, a second diode D2, and a third diode D3.

The first diode D1 is connected in parallel to the first cell group CU1. In more detail, the first diode D1 is connected to the first bus bar 810 and the second connection electrode 720. That is, one terminal of the first diode D1 is connected to the first bus bar 810 and the other terminal is connected to the second connection electrode 720.

When the first cell group CU1 is disabled, a current generated in the second group CU2 and the third cell group CU3 may detour via the first diode D1.

The second diode D2 is connected in parallel to the second cell group CU2. In more detail, the second diode D2 is connected to the second connection electrode 720 and the third connection electrode 730. That is, one terminal of the second diode D2 is connected to the second connection electrode 720 and the other terminal is connected to the third connection electrode 730.

When the second cell group CU2 is disabled, a current generated in the first group CU1 and the third cell group CU3 may detour via the second diode D2.

The third diode D3 is connected in parallel to the third cell group CU3. In more detail, the third diode D3 is connected to the third connection electrode 730 and the second bus bar 820. That is, one terminal of the third diode D3 is connected to the third connection electrode 730 and the other terminal is connected to the second bus bar 820.

When the third cell group CU3 is disabled, a current generated in the first group CU1 and the second cell group CU2 may detour via the third diode D3.

As shown in FIG. 5, the junction box 800 is attached to the substrate 100. In more detail, the junction box 800 may be attached to the rear side of the substrate 100. The junction box 800 receives the diodes D1, D2, and D3. The junction box 800 may receive a circuit substrate 100 that the diodes D1, D2, and D3, the first bus bar 810, the second connection electrode 720, the fourth connection electrode 740, and/or the second bus bar 820 contact.

A solar battery module according to an embodiment may operate overall even when some of the cell groups CU1, CU2, and CU3 are disabled. For example, as shown in FIG. 5, when a part or all of the third cells A33 are disabled or defective due to shadow or foreign substance, the second cell group CU2 may not generate power.

At this point, a current generated in the first group CU1 and the third cell group CU3 may detour via the second diode D2. That is, a current generated in the first group CU1 and the third cell group CU3 may flow through the second bus bar 820, the third cell group CU3, the second diode D2, the third cell group CU1, and the first bus bar 810.

Accordingly, the solar battery module may separately drive each of the cell groups CU1, CU2, and CU3 and overall performance deterioration caused when some cell groups are disabled may be prevented.

Accordingly, the solar battery module according to an embodiment may have improved photoelectric conversion efficiency.

FIGS. 6 to 18 are views illustrating manufacturing processes of a solar battery module according to a first embodiment. FIGS. 7 to 18 are sectional views taken along the lines 0-0' and I-I' of FIG. 6. Description for this manufacturing method will refer to that for the above-mentioned solar battery module. That is, the description for the above solar battery module may be substantially combined to that for this manufacturing method.

Figure 6:
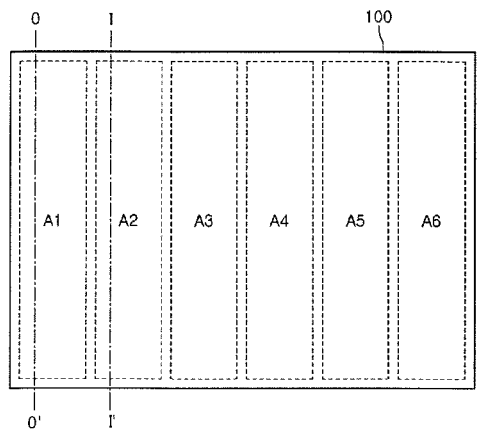
FIGS. 6 to 18 are views illustrating manufacturing processes of a solar battery module according to a first embodiment

Referring to FIG. 6, provided is a substrate 100 including a first area A1, a second area A2, a third area A3, a fourth area A4, a fifth area A5, and a sixth area 6.

The substrate 100 is formed of glass and may include a ceramic (such as alumina) substrate 100, a stainless steel or titanium substrate 100, or a polymer substrate 100.

The glass substrate 100 may be formed of soda lime glass and the polymer substrate 100 may be formed of polyimide.

Additionally, the substrate 100 may be rigid or flexible.

The N number of cells may be formed in each of the first area A1, the second area A2, the third area A3, the fourth area A4, the fifth area A5, and the sixth area 6.

FIGS. 7 to 18 are sectional views taken along the lines 0-0' and I-I' of FIG. 6. The first area A1, the third area A3, and the fifth area A5 are formed with the same shape and the second area A2, the fourth area A4, and the sixth area A6 are formed with the same shape. Therefore, only the sectional view of the first area A1 and the second area A2 will be shown.

Figure 7:
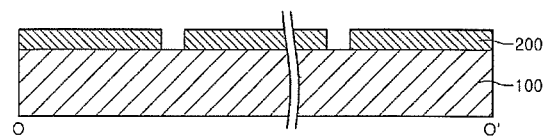
Figure 8:
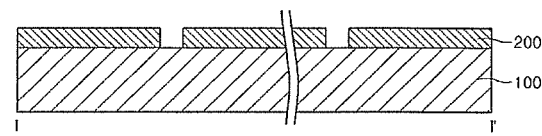

As shown in FIGS. 7 and 8, a back electrode pattern 200 is formed on the substrate 100. The back electrode pattern 200 includes a plurality of back electrodes. The back electrode pattern 200 is formed after a back electrode layer is formed on the substrate 100 and a photo-lithography process is performed to pattern the back electrode layer.

Or, after a mask is disposed on the substrate 100, the back electrode pattern 200 may be formed in each area. The back electrode pattern 200 may be formed of a conductor such as metal.

For example, the back electrode pattern 200 may be formed using a Mo target through a sputtering process. This is because Mo has high electrical conductivity, ohmic contact with a light absorbing layer, and high temperature stability under Se atmosphere.

Additionally, although not shown in the drawings, the back electrode pattern 200 may be formed with at least one layer. When the back electrode pattern 200 is formed with a plurality of layers, layers constituting the back electrode pattern 200 may be formed of respectively different materials.

Additionally, the back electrode pattern 200 may be disposed with a stripe shape or a matrix shape and may correspond to each cell. However, the back electrode pattern 200 is not limited to the above shape and may be formed with various shapes.

Figure 9:
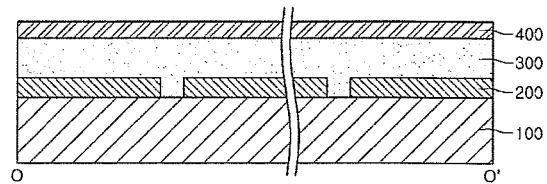
Figure 10:
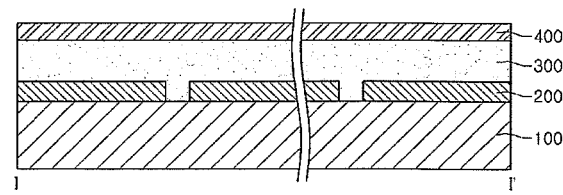

Later, referring to FIGS. 9 and 10, a light absorbing layer 300 and a buffer layer 400 are formed on the back electrode pattern 200.

The light absorbing layer 300 includes a Group I-III-VI based compound. In more detail, the light absorbing layer 300 includes a $Cu(In, Ga)Se_2$ based (CIGS based) compound.

Unlike this, the light absorbing layer 300 may includes a $CuInSe_2$ based (CIS based) compound or a $CuGaSe_2$ based (CGS based) compound.

For example, in order to form the light absorbing layer 300, a CIG based metal precursor layer is formed on the back electrode pattern 200 by using a Cu target, an In target, and a Ga target. Later, after a reaction of the metal precursor layer and Se is completed through a selenization process, a CIGS based light absorbing layer is formed.

Additionally, during the metal precursor layer forming process and the selenization process, an alkali element in the substrate 100 is diffused into the metal precursor layer and the light absorbing layer 300 through the back electrode pattern 200. The alkali element improves the grain size and crystallization of the light absorbing layer 300.

Additionally, the light absorbing layer 300 may be formed using Cu, In, Ga, and Se through co-evaporation.

The light absorbing layer 300 receives external incident light and converts it to electric energy. The light absorbing layer 300 generates photoelectron-motive force through photoelectric effect.

The buffer layer 400 may be formed of at leas one layer and may be formed by stacking at least one of CdS, ITO, ZnO, and i-ZnO on the substrate 100 having the light absorbing layer 300.

At this point, the buffer layer 400 is an n-type semiconductor layer and the light absorbing layer 300 is a p-type semiconductor layer. Accordingly, the light absorbing layer 300 and the buffer layer 400 form a pn junction.

The buffer layer 400 is disposed between the light absorbing layer 300 and a front electrode formed later. That is, since the light absorbing layer 300 and the front electrode layer 500 have a large difference in lattice constant and energy band gap, the buffer layer 400 having an intermediate band gap of the layers 300 and 500 is inserted therebetween to form an excellent junction.

According to this embodiment, although one buffer layer is formed on the light absorbing layer 300, the present invention is not limited thereto and thus the buffer layer 400 may be formed of a plurality of layers.

Figure 11:
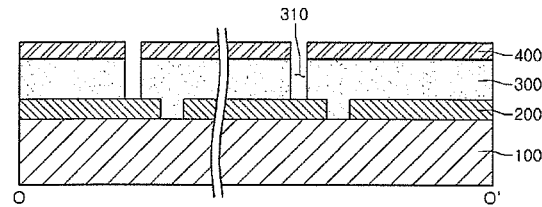
Figure 12:
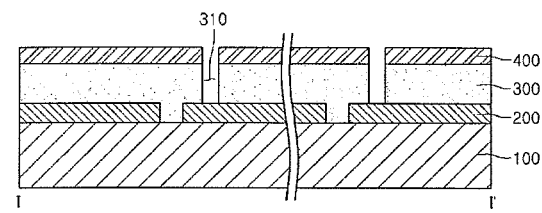

Later, referring to FIGS. 11 and 12, a contact pattern 310 penetrating the light absorbing layer 300 and the buffer layer 400 is formed. The contact pattern 310 may be formed through a mechanical method and a portion of the back electrode pattern 200 is exposed.

Figure 13:
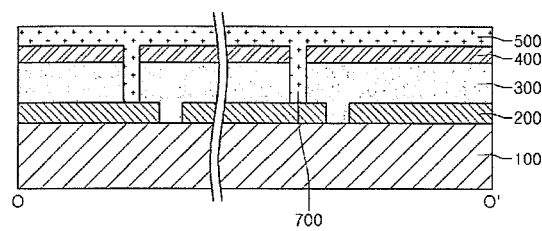
Figure 14:
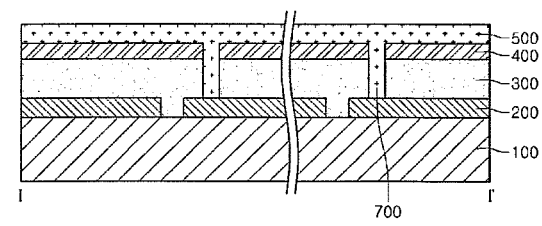

Referring to FIGS. 13 and 14, a front electrode 500 and a connection line 700 are formed by stacking a transparent conductive material on the buffer layer 400.

When the transparent conductive material is stacked on the buffer layer 400, it may be inserted in the contact pattern 310 to form the connection line 700.

The back electrode pattern 200 and the front electrode 500 are electrically connected to each other through the connection line 700.

The front electrode 500 is formed of a ZnO doped with Al through a sputtering process on the substrate 100.

The front electrode 500 is a window layer forming a pn junction with the light absorbing layer 300. Since the front electrode 500 serves as a transparent electrode at the front side of the solar battery, it is formed of a ZnO having high light transmittance and excellent electrical conductivity.

At this point, an electrode having low resistance may be formed by doping the ZnO with Al.

A ZnO thin film, i.e., the front electrode 500, may be formed through an RF sputtering method using a ZnO target, a reactive sputtering method using a Zn target, and a metal organic chemical vapor deposition method.

Additionally, a double structure, in which an Indium Tin Oxide (ITO) thin film having excellent electro-optical property is deposited on the ZnO thin film, may be formed.

Figure 15:
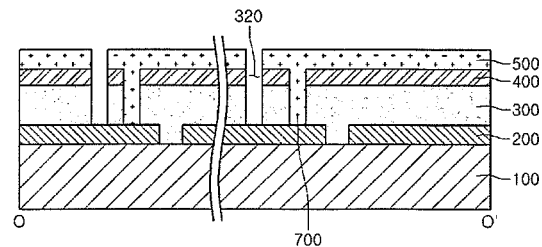
Figure 16:
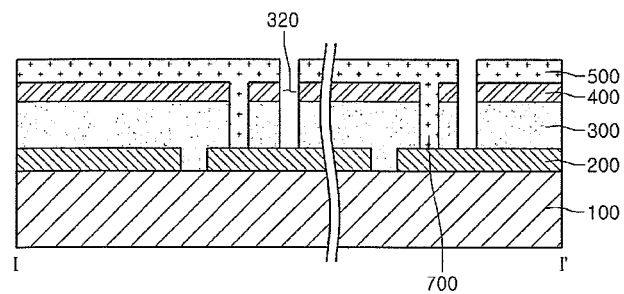

As shown in FIGS. 15 and 16, a separation pattern 320 penetrating the light absorbing layer 300, the buffer layer 400, and the front electrode 500 is formed.

The separation pattern 320 may be formed through a mechanical method and a portion of the back electrode pattern 200 is exposed.

The buffer layer 400 and the front electrode 500 may be separated by the separation pattern 320 and also each cell is separated by the separation pattern 320.

The front electrode 500, the buffer layer 400, and the light absorbing layer 300 may be disposed with a stripe shape or a matrix shape by the separation pattern 320. However, the separation pattern 320 is not limited to the above shape and may be formed with various shapes.

A plurality of cells are formed on the substrate 100 by the separation pattern 320. The plurality of cells may include a first cell group CU1, a second cell group CU2, and a third cell group CU3.

Figure 17:
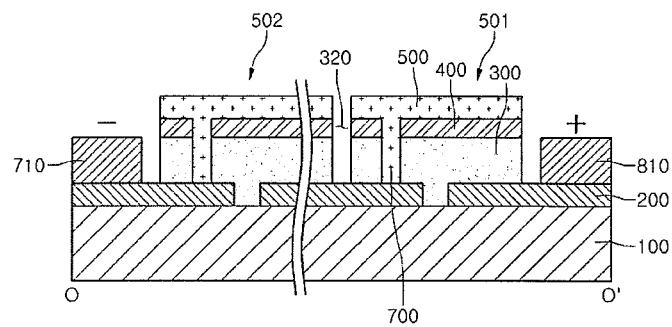
Figure 18:
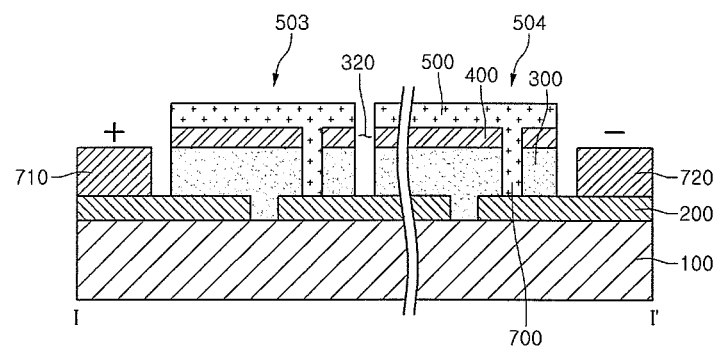

As shown in FIGS. 17 and 18, a first bus bar 810, a first connection electrode 710, and a second connection electrode 720 are formed to be connected to the back electrode pattern 200.

The first bus bar 810, the first connection electrode 710, and the second connection electrode 720 may be formed by removing portions of the front electrode 500, the buffer layer 400, and the light absorbing layer 300 at the both ends of the substrate 100 and then exposing the front electrode pattern 200.

In this embodiment, although the first bus bar 810, the first connection electrode 710, and the second connection electrode 720 are connected to the back electrode pattern 200, they are not limited thereto. That is, the first bus bar 810, the first connection electrode 710, and the second connection electrode 720 may be formed on the front electrode 500.

In order to form the first bus bar 810, the first connection electrode 710, the second connection electrode 720, the third connection electrode 730, the fourth connection electrode 740, the fifth connection electrode 750, and the second bus bar 820, a conductive paste is printed on the exposed back electrode pattern 200. The printed conductive paste is sintered, and then the first bus bar 810, the first connection electrode 710, the second connection electrode 720, the third connection electrode 730, the fourth connection electrode 740, the fifth connection electrode 750, and the second bus bar 820 are formed.

Additionally, first cells A11 in the first area A1 and second cells A22 in the second area A2 are formed symmetrical to each other.

That is, the first cells A11 may be formed with a structure in which the first bus bar 810 is connected to a (+) electrode and the first connection electrode 710 is connected to a (−) electrode. Additionally, the second cells A22 may be formed with a structure in which the first connection electrode 710 is connected to a (+) electrode and the second connection electrode 720 is connected to a (−) electrode.

At this point, the back electrode pattern 200 in the first area A1 and the back electrode pattern 200 in the second area A2 may be connected to each other through the first connection electrode 710. Accordingly, the first cells A11 and the second cells A22 may be connected in series to each other.

Later, a first diode D1 is disposed between the first bus bar 810 and the second connection electrode 720, a second diode D2 is disposed between the second connection electrode 720 and the fourth connection electrode 740, and a third diode D3 is disposed between the fourth connection electrode 740 and the second bus bar 820.

In this manner, each of the cell groups CU1, CU2, and CU3 is separately driven, so that a solar battery module having improved photoelectric conversion efficiency may be provided.

Figure 19:
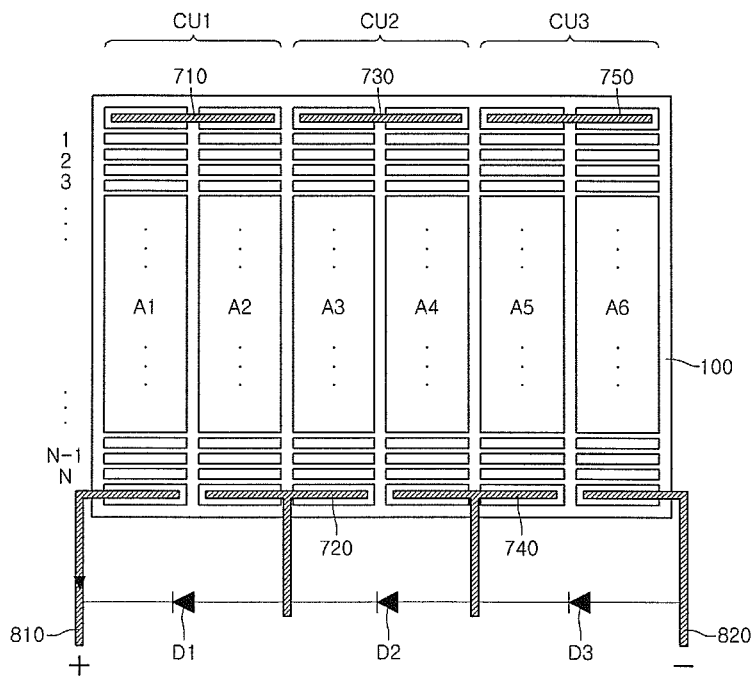
FIG. 19 is a plan view illustrating the front side of a thin film solar battery module according to a second embodiment.
Figure 20:
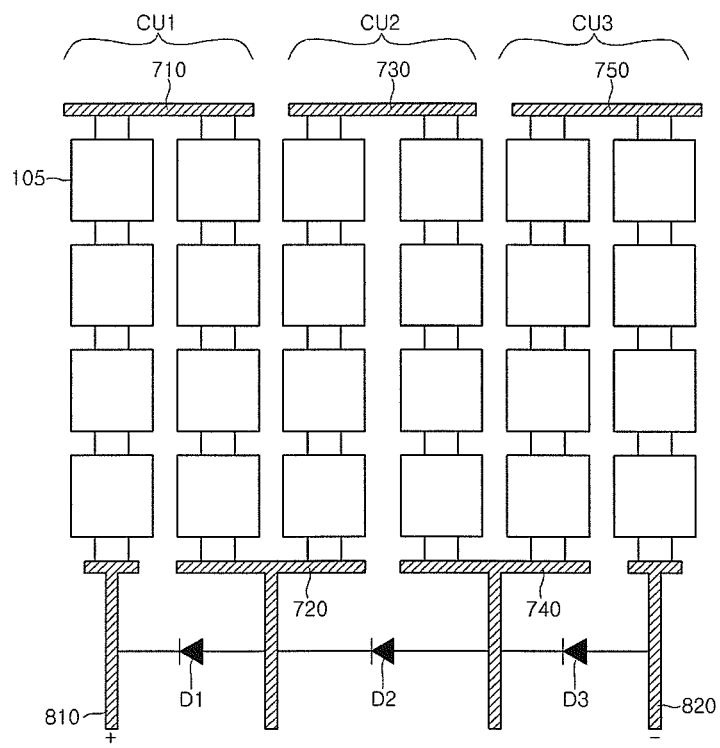
FIG. 20 is a plan view illustrating the front side of a bulk type thin film solar battery module according to a second embodiment.
Figure 21:
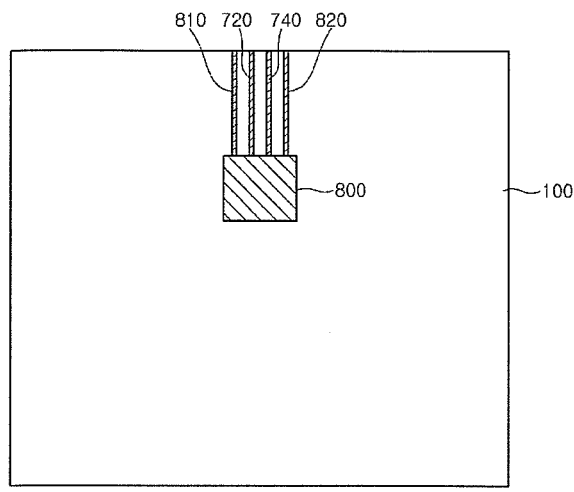
FIG. 21 is a plan view of a junction box at the rear side of a substrate.
Figure 22:
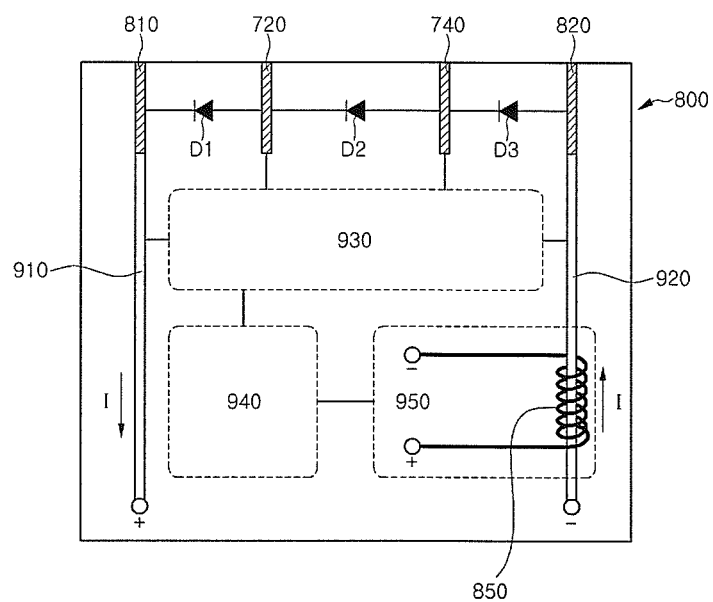
FIG. 22 is a plan view illustrating the inner structure of a junction box.
Figure 23:
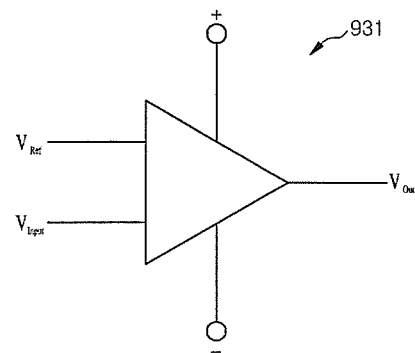
FIG. 23 is a view of a comparator.
Figure 24:
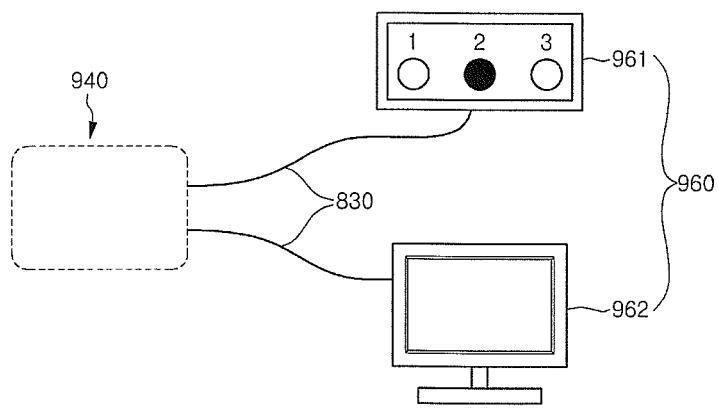
FIGS. 24 and 25 are views of a display means.
Figure 25:
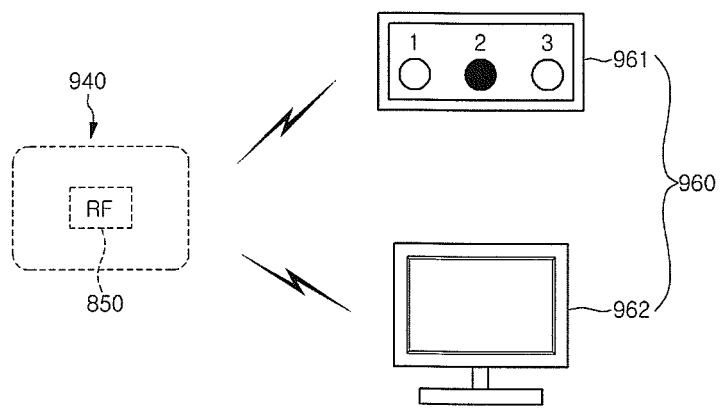

FIG. 19 is a plan view illustrating the front side of a thin film solar battery module according to a second embodiment. FIG. 20 is a plan view illustrating the front side of a bulk type thin film solar battery module according to a second embodiment. FIG. 21 is a plan view of a junction box at the rear side of a substrate. FIG. 22 is a plan view illustrating the inner structure of a junction box. FIG. 23 is a view of a comparator. FIGS. 24 and 25 are views of a display means. Description for this embodiment refers to that for the above-mentioned embodiments. That is, except for the modified portions, the description for the above embodiments may be substantially combined to that for this embodiment.

Referring to FIGS. 19 to 25, the solar battery module according to the second embodiment includes a solar battery panel having a plurality of cell groups CU1, CU2, and CU3 disposed on a substrate 100, and a junction box 800.

The substrate 100 is formed of glass and may include a ceramic (such as alumina) substrate, a stainless steel or titanium substrate, or a polymer substrate.

Each of the cell groups CU1, CU2, and CU3 includes a plurality of cells. The plurality of cells may be formed of a $Cu(In, Ga)Se_2$, (CIGS based) compound, a $CuInSe_2$, (CIS based) compound, or a $CuGaSe_2$ (CGS based) compound.

A bus bar 810 is connected to the first cells A11 and a second bus bar 820 is connected to the sixth cells A66. The first cells A11, the second cells A22, the third cells A33, the fourth cells A44, the fifth cells A55, and the sixth cell A66 may be connected in series to each other through the connection electrodes 710, 720, 730, 740, and 750.

The first diode D1, the second diode D2, and the third diode D3 detour current when one of the cell groups CU1, CU2, and CU3 is disabled. For example, when a shadow is casted on or a defect occurs in the second cell group CU2, the resistance of the second cell group CU2 is increased. At this point, a current generated in the first group CU1 and the third cell group CU3 may detour via the second diode D2.

The first diode D1 the second diode D2, and the third diode D3 are disposed in the junction box 800 at the rear side of the substrate 100. Additionally, the first bus bar 810, the second connection electrode 720, the fourth connection electrode 740, and the second bus bar 820 extend to the junction box 800.

Additionally, a solar battery module according to an embodiment is not limited to the thin film solar battery module of FIG. 19, and thus may be a bulk solar battery module of FIG. 20.

As shown in FIG. 20, bulk solar batteries 105, where an n-type layer is formed on a p-type Si substrate to from a PN junction, are connected in series, so that a solar battery module may be formed.

Additionally, the solar batteries 105 are connected to each other in the bulk solar battery module through the connection electrodes 710, 720, 730, 740, and 750. Additionally, the first bus bar 810 and the second bus bar 820 may be connected to the solar batteries at the both ends of the bulk solar battery module.

Referring to FIGS. 21 to 25, the solar battery module according to the this embodiment includes the first diode D1, the second diode D2, the third diode D3, a first output terminal 910, a second output terminal 920, a power supply unit 950, an error detection unit 930, and a signal output unit 940.

The first diode D1, the second diode D2, the third diode D3, the first output terminal 910, the second output terminal 920, the power supply unit 950, the error detection unit 930, and the signal output unit 940 may be received in the junction box 800.

The first output terminal 910 is connected to the first bus bar 810. Unlike this, the first bus bar 810 may extend to form the first output terminal 910. The second output terminal 920 is connected to the second bus bar 820. Unlike this, the second bus bar 820 may extend to form the second output terminal 920.

The first output terminal 910 and the second output terminal 920 may be connected to a power conversion system converting DC power into AC power having a predetermined frequency.

The power supply unit 950 includes a coil 850. The coil 850 is disposed at the second output terminal 920. When a current generated by the cells in the cell groups CU1, CU2, and CU3 flows in the second output terminal 920, a magnetic field is changed and an included current flows in the coil 850. The power supply unit 950 may generate a power source by using a current generated through the electromagnetic induction phenomenon.

Additionally, the power supply unit 950 may supply the generated power to the error detection unit 930 and the signal output unit 940. Especially, when some of the cell groups CU1, CU2, and CU3 are disabled, a current flowing through the second output terminal 920 is changed. At this point, the power supply unit 950 may supply power through an induction current generated by the changed current.

The error detection unit 930 detects errors of the cell groups CU1, CU2, and CU3. In more detail, the error detection unit 930 may detect disabled ones from the cell groups CU1, CU2, and CU3.

The error detection unit 930 includes a comparator 931. The error detection unit 930 receives a voltage from the both ends of the first diode D1, the both ends of the second diode D2, and the both ends of the third diode D3. Additionally, The error detection unit 930 detects errors of the cell groups CU1, CU2, and CU3 by comparing the inputted voltage with a reference voltage.

That is, signals such as the voltage inputted in the error detection unit 930 may be applied to a circuit having the comparator 931. Additionally, which cell groups are shaded or have defects may be detected through the signals.

The signal output unit 940 receives the signals generated from the error detection unit 930 and transmits them to external. That is, the signal output unit 940 outputs the signals from the error detection unit 930 to the external display means 960.

As shown in FIG. 23, the comparator 931 may include an operational amplifier (OP). The comparator 931 compares a reference voltage $V_{Ref}$ with an input $V_{Input}$ and outputs an output voltage $V_{Out}$. At this point, the reference voltage $V_{Ref}$ may be more than or equal to about 0.7V, i.e., a voltage of the diode, and the input voltage $V_{Input}$ may be signals of the both ends of each of the diodes D1, D2, and D3.

Accordingly, the comparator 931 may vary according to the number of the diodes D1, D2 and D3 and according to this embodiment, at least three comparators may be included in the error detection unit 930.

If there is no showdown on or no defect in the cell groups CU1, CU2, and CU3, a voltage of each of the cell groups CU1, CU2, and CU3 is measured at the both ends of each of the diodes D1, D2, and D3.

However, if there is a shadow on or a defect in a part of the solar battery cell, a voltage at the both ends of each of the diodes D1, D2, and D3 may be measured at about 0.7V, i.e., a voltage of the diode.

Accordingly, when the comparator 931 sets about 1V as the reference voltage $V_{Ref}$ and applies the voltage at the both ends of each of the diodes D1. D2, and D3 as the input voltage $V_{Input}$ and a signal less than the reference voltage $V_{Ref}$ occurs, the error detection unit 930 may be designed to output the output voltage $V_{Out}$.

For example, if there is a shadow on or a defect in the second cell group CU2, the voltage of the second connection electrode 720 and the fourth connection electrode 740 at the both ends of the second diode D2 are measured at about 0.7V.

When about 0.7V, i.e., the voltage at the both ends of the second diode D2, is inputted as the input voltage $V_{Input}$, since the input voltage $V_{Input}$ is less than about 1V, i.e., the reference voltage $V_{Ref}$, the output voltage $V_{Out}$ is generated by the comparators 931 and 200. The output voltage $V_{Out}$ generated by the comparator 931 is transmitted to the signal output unit 940.

Referring to FIGS. 24 and 25, the signal output unit 940 outputs a signal to the external display means 960 in response to the signals from the error detection unit 930. The display means 960 may be a flasher 961 such as an LED lamp or an image means 962 such as a monitor. At this point, the flasher 961 or the image means 962 may be connected to the signal output unit 940 through the connection line 830.

Additionally, the signal output unit 940 may include a Radio Frequency (RF) module 850. When the RF module 850 is included in the signal output unit 940, a signal may be transmitted to the display means 960 without the connection line 830.

According to the solar battery module and the method of detecting an error thereof, the power supply unit 950, the error detection unit 930, the signal output unit 940 are included in the junction box to determine whether there is a shadow on or a defect in an entire solar battery module.

Additionally, the solar battery module according to this embodiment may determine which cell has a shadow or a defect by using the error detection unit 930.

Additionally, the power supply unit 950 may drive the error detection unit 930 and the signal output unit 940 without additional power because a coil is disposed in the power supply unit 950.

As mentioned above, the solar battery module is described and may correspond to a solar cell apparatus in a broad sense. Accordingly, the above-mentioned embodiments may be applied to various solar cell apparatuses.

Additionally, the features, structures, and effects described in the above embodiments are included in at least one embodiment, but the present invention is not limited thereto. Furthermore, the features, structures, and effects in each embodiment may be combined or modified for other embodiments by those skilled in the art Accordingly, contents regarding the combination and modification should be construed as being in the scope of the present invention.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

A solar cell apparatus according to an embodiment is used for photovoltaic power generation fields.

The invention claimed is:
1. A solar cell apparatus comprising:
   a substrate;
   a first cell group comprising a plurality of first cells connected in series to each other on the substrate;
   a second cell group comprising a plurality of second cells connected in series to each other on the substrate;
   a first bus bar connected to the first cell group;
   a second bus bar connected to the second cell group;
   a first connection electrode connecting the first cell group and the second cell group;
   a first diode connected to the first bus bar and the first connection electrode;
   a second diode connected to the first connection electrode and a second connection electrode;
   an error detection unit connected to first and second ends of each of the diodes, the error detection unit including a comparator for comparing a reference voltage with an input voltage and outputting an output voltage, wherein the input voltage is a signal of the first and second ends of each of the diodes, wherein the comparator outputs the output voltage when the input voltage is lower than the reference voltage; and a signal output unit connected to the error detection unit that receives a signal including the output voltage generated from the error detection unit and transmits it externally.

2. The solar cell apparatus according to claim 1, further comprising:

a third cell group on the substrate; and a third diode connected in parallel to the third cell group.

3. The solar cell apparatus according to claim 2, further comprising a junction box receiving the first diode, the second diode, and the third diode.

4. The solar cell apparatus according to claim 1, wherein the first cell group comprises first cell group first cells in a first column and first cell group second cells in a second column; and the first cell group first cells and the first cell group second cells are connected through a first cell group first connection electrode.

5. The solar cell apparatus according to claim 4, wherein a current flows in a first direction through the first cell group first cells; and the current flows in a second direction opposite to the first direction through the first cell group second cells.

6. The solar cell apparatus according to claim 4, wherein the first cell group comprises first cell group third cells in a third column and first cell group fourth cells in a fourth column;

the first cell group second cells and the first cell group third cells are connected through a first cell group second connection electrode; and the first diode and the second diode are electrically connected to the first cell group second connection electrode.

* * * * *